United States Patent
Reverdy et al.

(10) Patent No.: US 7,409,026 B2
(45) Date of Patent: Aug. 5, 2008

(54) DEVICE AND METHOD FOR DETECTING THE PHASE OF A SIGNAL

(75) Inventors: Jacques Reverdy, Crolles (FR); Elisabeth Crochon, Poisat (FR); Gerard Robert, Poisat (FR); Thierry Thomas, Varces Allieres et Risset (FR)

(73) Assignee: Commissariat A l'Energie Atomique, Paris (FR)

( * ) Notice: Subject to any disclaimer, the term of this patent is extended or adjusted under 35 U.S.C. 154(b) by 561 days.

(21) Appl. No.: 11/080,643

(22) Filed: Mar. 16, 2005

(65) Prior Publication Data

US 2005/0207484 A1    Sep. 22, 2005

(30) Foreign Application Priority Data

Mar. 17, 2004    (FR) .................................. 04 50534

(51) Int. Cl.
*H04L 25/40*    (2006.01)
(52) U.S. Cl. ....................................... 375/371
(58) Field of Classification Search ............... 375/226, 375/362, 371, 373, 374, 375; 327/2, 3, 163, 327/231, 233, 234, 236, 244
See application file for complete search history.

(56) References Cited

U.S. PATENT DOCUMENTS

| | | | |
|---|---|---|---|
| 5,297,180 A | * | 3/1994 | Upp et al. ................... 375/363 |
| 5,703,480 A | * | 12/1997 | Zwack ...................... 324/76.82 |
| 5,723,989 A | | 3/1998 | Steinlechner |
| 5,854,576 A | * | 12/1998 | Swan .......................... 331/57 |
| 6,049,297 A | | 4/2000 | Ducharme et al. |
| 6,486,716 B1 | | 11/2002 | Minami et al. |

OTHER PUBLICATIONS

Dulk et al. Improved Phase-Locked Loop Performance with Adaptive Phase Comparators IEEE, vol. AES-18, No. 3, May 1982, p. 323-332.*

* cited by examiner

*Primary Examiner*—Sam K Ahn
(74) *Attorney, Agent, or Firm*—Oblon, Spivak, McClelland, Maier & Neustadt, P.C.

(57) ABSTRACT

A device and method for estimating a phase reference or a phase shift of a $S_1$ with respect to another reference signal $S_0$.

21 Claims, 3 Drawing Sheets

DEVICE AND METHOD FOR DETECTING THE PHASE OF A SIGNAL

TECHNICAL FIELD AND BACKGROUND ART

This invention relates to a method and a device for extracting the phase of a signal, possibly comprising noise, or a phase reference of a modulated signal, possibly comprising noise.

It is used particularly in applications in the domain of RFID (Radio Frequency IDentification) systems. An RFID system is usually formed from a first device containing stored data, usually called label, capable of transmitting these data in the form of radio waves at a frequency within a range usually between a few kHz and a few MHz. A second read device is then provided for acquisition of said stored data. To achieve this acquisition, the second device is capable of emitting a signal S formed from a carrier. In response to this signal S, the first device then emits another signal S' containing said data. This other signal S' is usually formed by a sub-carrier with a frequency proportional to the frequency of said carrier, according to a predetermined protocol. The other signal S' may be modulated, for example using a phase modulation.

The read device should preferably be capable of detecting a phase reference of this other signal S', so that the read device can demodulate the other signal S'. To achieve this, a number of cycles may be specifically inserted at the beginning of the other signal S' so that the read device will have the time to detect this phase reference. One known method called the "correlation method" is currently used to do this detection type. This method consists of multiplying one or several cycles of said other signal S', for which the phase reference is searched by one or several cycles of a reference signal $S_0$ with a frequency identical to the frequency of said sub-carrier.

The analogue or digital results obtained from these multiplications are integrated over one or several periods. These operations are repeated regularly in time and are a maximum at the instant at which the other signal S' and the reference signal $S_0$ are in phase. The moment at which this maximum occurs corresponds to an instant used as the phase reference for the other signal S'.

This method has the disadvantage that it lacks precision, particularly when the other signal S' comprises noise. It also requires the use of a large number of resources in the read device.

SUMMARY OF THE INVENTION

This invention proposes a method for estimating or measuring the phase shift of a signal $S_1$, with a period approximately equal to a period Ts with respect to a reference signal $S_0$ with period Ts, comprising steps consisting of receiving the signal $S_1$ and starting a capture process including steps consisting of:

a) at instants regularly distributed within a first time interval equal to the period Ts, carry out a sequence of n detections of the state of the signal $S_1$, where n is an integer greater than 1, and for each of these detections increasing a given count variable in a sequence of n count variables, or leaving it unchanged depending on the said state b) reiterate step a) over one or several other time intervals, each equal to the said first time interval, c) stop the capture process at an end of capture instant $t_{end}$, d) compare the corresponding values of count variables for adjacent count means, in pairs in the said sequence of count variables, e) identify the two adjacent count variables $x_j$ and $x_{j+1}$ with the greatest difference, among the differences between two adjacent variables, where j is an integer.

The phase shift between the reference signal $S_0$ and the signal $S_1$ may be estimated after step e) by a phase shift value between $(j/n)*2\Pi$ and $((j+1)/n)*2\Pi$, for example $(j/n)*2\Pi$.

The processed signal $S_1$ may be a digital signal, digitized on one or several bits. This signal may also be a digital signal, obtained by digitization of an analogue signal or by processing of an analogue signal.

The signal $S_1$ may possibly be an analogue signal. In this case, a processing step of the signal $S_1$, for example using one or several comparators or using an analogue/digital converter, may be provided before starting the capture process.

In step a), the increase in a count variable may correspond to an increment of said count variable by a fixed increment value, or by an increment value that can vary as a function of said detected state.

For example, in the case in which the signal $S_1$ is digitized on several bits and uses a signed logic, it would be possible that the increment value is signed and that the sign of the increment value varies as a function of the state of the detected signal $S_1$. It would also be possible for the said increment value to vary as a function of the state of the detected signal $S_1$ and the average value or the average state of the signal $S_1$ at the detection instant.

The increase of a count variable may also correspond to an operation other than an increment on this count variable. For example, it may consist of a multiplication of this variable by a value that depends on the state of the detected signal $S_1$.

The capture process according to the invention may be reiterated for an integer number of periods with duration Ts. According to one variant, the capture process done in step b) and in step c) may be reiterated until one of the said count variables reaches a value Xthreshold_1. This threshold value Xthreshold_1 may be predetermined and fixed, or according to one variant it may be initialized to be equal to a predetermined value and then vary during the capture process, for example as a function of the signal-to-noise ratio relative to the signal $S_1$ and/or the information throughput relative to the signal $S_1$.

According to a second variant, the capture process may be reiterated until the difference in the count variable at the output from the two adjacent count means reaches a threshold Xthreshold_2.

This threshold Xthreshold_2 may be predetermined and fixed, or according to one variant it may be initialized to be equal to a predetermined value and then vary during said capture process, for example as a function of the signal-to-noise ratio relative to signal $S_1$, or the information throughput carried by signal $S_1$.

The invention also relates to a method of reading a transponder or a label comprising:

emission of a signal with a predetermined frequency, by a read device, reception of another signal $S_1$ emitted by the transponder or the label, by the read device, implementation of one of the previously described processes.

The signal $S_0$ may be generated by the read device, starting from said signal with a predetermined frequency, for example by frequency division of said signal, with a predetermined frequency or using a local oscillator integrated into the read device.

The invention also relates to a device for estimating the phase shift of a signal $S_1$ with a period approximately equal to Ts with respect to a reference signal $S_0$ with period Ts, comprising:

n count means, each of the count means when activated being capable of detecting an instantaneous state of signal $S_1$ and increasing a count variable with which it is associated among n count variables, or leaving it unchanged, as a function of said detected instantaneous state, control means capable of periodically and successively activating said n count means in a predetermined order, within a time interval with a duration equal to the period Ts of the signal $S_0$ and at regularly distributed instants in said time interval, comparator means capable of comparing the values of count variables in each adjacent count means, among the n count variables of the n count means, in pairs, and when the comparison is made, the said comparator means determine the greatest difference.

The phase shift estimating device according to the invention may also comprise:

means for estimating the phase shift between $S_0$ and $S_1$ as a function of said greatest determined difference.

According to one particular embodiment of the device, when activated, each of the count means may be capable of detecting an instantaneous state of the signal $S_1$ and incrementing a count variable with which it is associated among the n count variables, or leaving it unchanged, as a function of said instantaneous detected state.

The device may also include means for determining the average value or the average state M of the signal $S_1$. Each of the count means can then be designed so that when it is activated, it detects an instantaneous state of the signal $S_1$ and increments a count variable with which it is associated among N count variables, or leaves it unchanged, as a function of said instantaneous detected state and said average value M of the signal $S_1$.

Means for generating the signal $S_0$ with period $T_S$ may also be integrated into the device according to the invention. These means may include an oscillator such as a clock and/or frequency division means.

BRIEF DESCRIPTION OF THE FIGURES

This invention will be better understood after reading the description of example embodiments given purely for information and in no way limitative, with reference to the appended figures, wherein.

Identical, similar or equivalent parts of the different figures are marked with the same numeric references so as to facilitate comparison between one figure and the next.

The different parts shown in the figures are not necessarily shown at the same scale, to make the figures more easily understandable.

DETAILED DESCRIPTION OF PARTICULAR EMBODIMENTS

Figure 1:
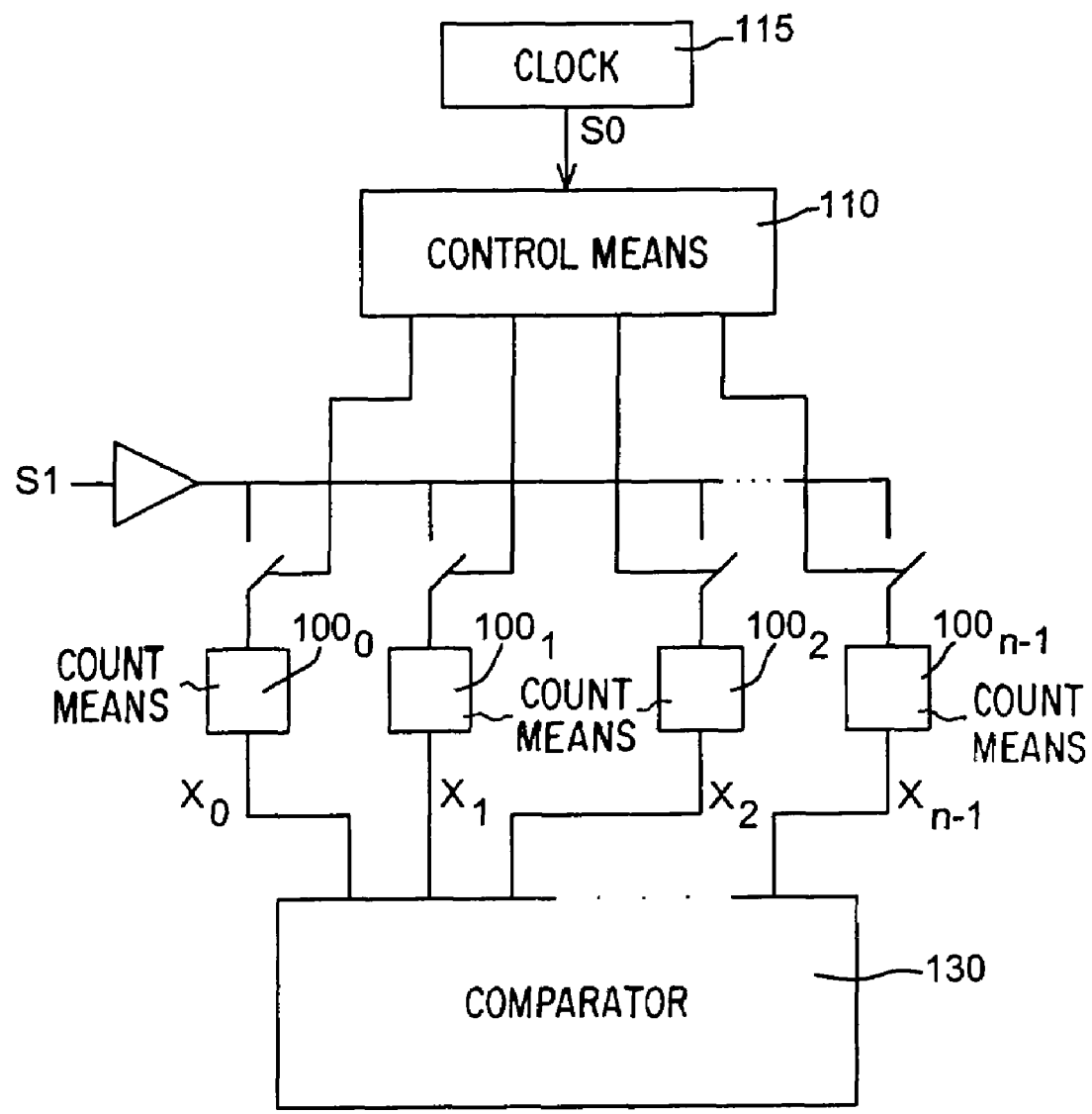
FIG. 1 illustrates an example device implemented according to the invention.

An example embodiment implemented according to the invention will now be described with reference to FIG. 1. In particular, this device enables determination in time of a phase reference instant, or it detects the phase of a signal $S_1$ with respect to a reference signal $S_0$ with period Ts, or it detects the phase shift of $S_1$ with respect to $S_0$.

The signal $S_1$ may for example be a digital signal, possibly comprising noise, with a period identical or similar to the period Ts of the reference signal $S_0$.

The signal $S_1$ may also for example be a digital signal with two modulated states, for example phase modulated from a carrier with a period equal to the period Ts of the reference signal $S_0$.

The device implemented according to the invention comprises firstly control means 110 receiving the input reference signal $S_0$, and periodically and successively activating n different count means $100_0, \ldots, 100_{n-1}$ within a time interval with a duration equal to the period Ts of the signal $S_0$ and at regularly distributed instants within the said time interval.

According to one particular embodiment, means denoted 115, for example in the form of a clock such as a piezoelectric based clock, may be integrated into the said device to generate and send the reference signal $S_0$ with period Ts, particularly at the input to control means 110.

After the signal $S_1$ has been received at the input to said device and starting from the moment at which this device begins to carry out a phase shift measurement process of the signal $S_1$, a given count means $100_i$ among the n count means $100_0, \ldots, 100_{n-1}$ may be activated, for example by control means 110 at instants $$t_i = t_0 + i*(Ts/n) + k*Ts \quad (1).$$

In the expression reference (1), '$t_0$' is a moment or instant at which a process for detection of the phase of signal $S_1$ begins. 'i' corresponds to the rank of the given count means $100_i$, which is the i(th) count means making a detection in a time interval equal to Ts, after a first count means $100_0$ has first made a detection within said time interval. 'n' is the total number of count means $100_0, \ldots, 100_{n-1}$, and 'k' is an integer corresponding to the total number of detections made by the given count means $100_i$.

The number n of count means may vary for example as a function of the required detection precision. According to one particular embodiment, the number n of count means may be equal to a power of 2.

Each of the different count means $100_0, \ldots, 100_{n-1}$ is associated with a count variable that it can modify and for which it produces the output value. The different count means $100_0, \ldots, 100_{n-1}$ produce the count variables $x_0, \ldots, x_{n-1}$ respectively at the output. The operating means of each of them are identical.

When a given count means $100i$ ($i \in [0;n-1]$) is activated by the control means 110 at a given time $t_i$ ($i \in [0;n-1]$), this given count means $100_i$ detects the state or the value of the signal $S_1$. The given count means $100_i$ is then capable of modifying or not modifying a given count variable $x_i$ ($i \in [0;n-1]$) with which it is associated and for which it produces the output value, depending on the detected state of the signal $S_1$.

The modification of the given count variable $x_i$, if any, consists of increasing the count variable by incrementing it, for example by an increment value $Q_1$.

Since the signal $S_1$ is a two-state signal, according to a first variant it would be possible, for example, for a given count means $100_i$ to increment the given count variable $x_i$ with which it is associated, by the increment value $Q_1$ when it detects a "high" state or a logical level of the signal $S_1$ equal to '1'. According to this first variant, the given count means $100_i$ leaves the given count variable $x_i$ with which it is associated unchanged when it detects a "low" state or a logical level of the signal $S_1$ equal to '0'.

According to a second variant, it would be possible for example for the given count means $100_i$ to increment the given count variable $x_i$ with which it is associated, by the increment value $Q_1$, when it detects a "low" state or a logical level of the signal $S_1$ equal to '0'. According to this second variant, the given count means $100_i$ leaves the given count variable $x_i$ with which it is associated unchanged when it detects a "high" state or a logical level of the signal $S_1$ equal to '1'.

Since this signal $S_1$ is a two-state signal, the count means $100_0, \ldots, 100_{n-1}$, may be made for example from counters formed in a given arrangement of logical gates.

Comparator means denoted 130 that can be connected to all the outputs from the different count means $100_0, \ldots, 100_{n-1}$ are used to compare the value of each count variable with the value of each "adjacent" or "neighbor" count variable.

A given count means $100_i$ will be called "neighbor" or "adjacent" to another count means $100_j$ when the said given count means is the count means that has made a detection just before or just after the other said count means $100_j$ among all of the count means $100_0, \ldots, 100_{n-1}$.

Figure 2:
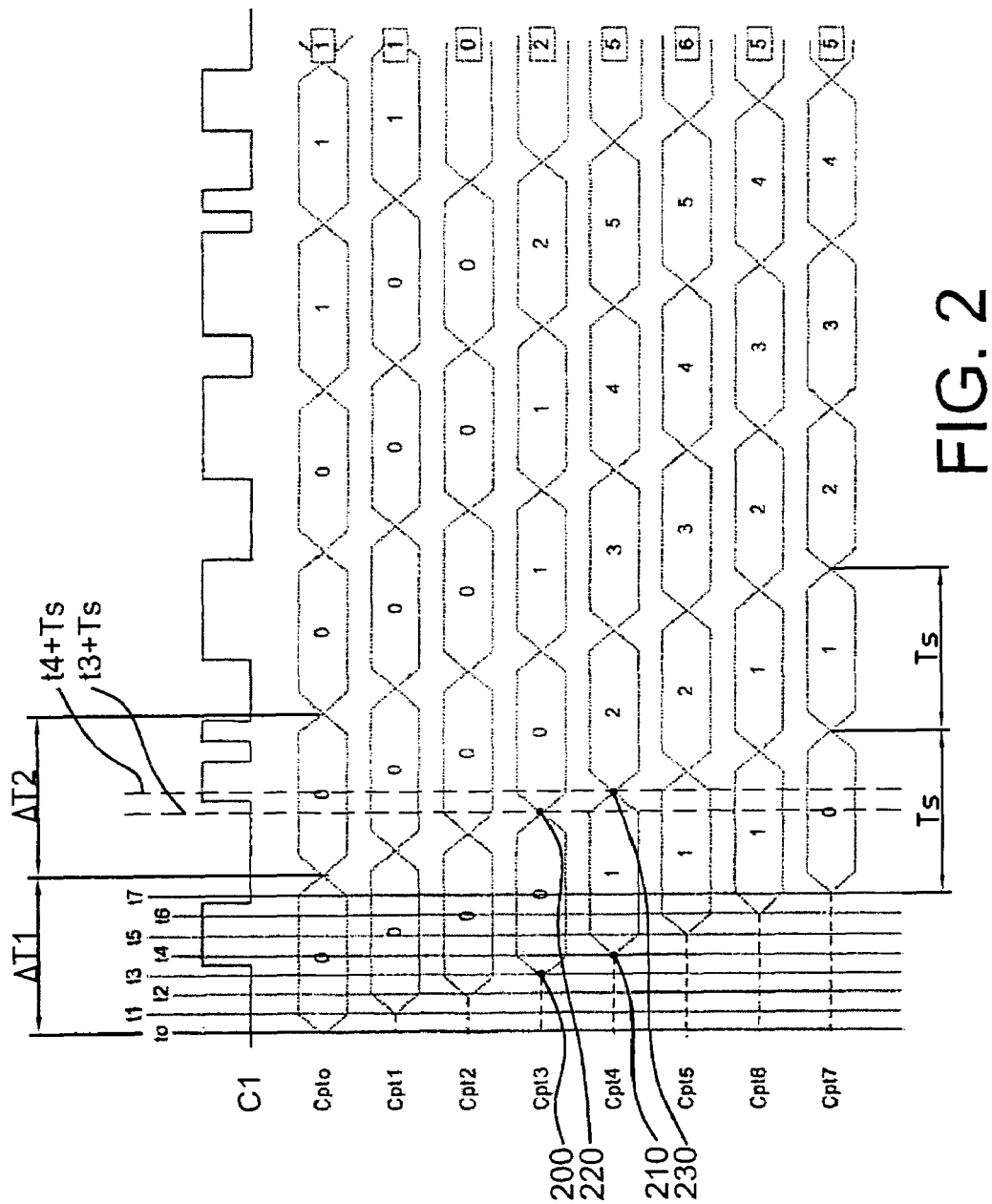
FIG. 2 illustrates a time diagram for operation of a device used according to the invention.

We will now present an example phase detection method according to the invention performed by a device of the type mentioned above, but in this case provided with n=8 count means $100_0, \ldots, 100_7$, explicitly with reference to FIG. 2.

The objective is to detect the phase of the signal $S_1$ (step curve denoted $C_1$) using the reference signal $S_0$ (not shown but for which the period is equal to Ts).

Operation of the different count means $100_0, \ldots, 100_7$ during time is shown in FIG. 2, by time diagrams denoted $Cpt_0, Cpt_1, Cpt_2, Cpt_3, Cpt_4, Cpt_5, Cpt_6, Cpt_7$, respectively.

At a given start time denoted to after the signal $S_1$ has been received at the input to said device implemented according to the invention, a process to capture the phase shift of $S_1$ with respect to $S_0$ begins.

Then, starting from this start moment or instant $t_0$, within a first time interval $\Delta T_1$ preferably equal to the period Ts of the reference signal $S_0$, the said control means 110 successively activate each of the different count means $100_0, \ldots, 100_7$ from the first count means $100_0$ to the eighth count means $100_7$ once only, at moments or instants denoted $t_0, t_1, t_2, t_3, t_4, t_5, t_6, t_7$, uniformly distributed during the said first time interval $\Delta T_1$.

The count means $100_0, \ldots, 100_7$ each perform a single detection of the signal $S_1$ and modify or do not modify the values of their corresponding count variables, once only, within the said first time interval $\Delta T_1$.

The count means $100_0, \ldots, 100_7$, are thus used to save successive images of the state of the signal $S_1$. Some of the count means $100_0, \ldots, 100_7$ will have detected a given state of the signal $S_1$ during the first time interval $\Delta T_1$. Other count means $100_0, \ldots, 100_7$ will have detected another state of the signal $S_1$.

For example, at an instant or moment denoted $t_3$ (reference 200 on time diagram $Cpt_3$) within the time interval $\Delta T_1$, the count means $100_3$ corresponding to the time diagram $Cpt_3$ has detected a <<low>> state of the signal $S_1$, the value of the count variable $x_3$ with which it is associated then remains unchanged and equal to the value 0. At another instant or moment denoted $t_4$ (reference 210 on time diagram $Cpt_4$) within the time interval $\Delta T_1$, the count means $100_4$ associated with the time diagram $Cpt_4$ has detected a <<high>> state of the signal $S_1$, the value of the count variable $x_4$ with which it is associated is then incremented and set equal to the value 1.

Since the first time interval $\Delta T_1$, is equal to the period Ts of the signal $S_0$, the phase reference or the phase origin of the signal $S_1$ is between two instants or moments $t_j$ and $t_{j+1}$ (where $j \in [0;6]$) at which the signal $S_1$ is detected by two adjacent count means $100_j$ and $100_{j+1}$ respectively. At the end of the time interval $\Delta T_1$, the said two adjacent count means $100_j$ and $100_{j+1}$ will have corresponding count variables $x_j$ and $x_{j+1}$ with different values, one of the said two adjacent count means having detected a certain logical state of the signal for example a <<low>> state, and the other having detected another logical state of the signal, for example a <<high>> state.

Since the signal $S_1$ may comprise noise or a may be a modulated signal possibly comprising noise, once the first time interval $\Delta T_1$ has elapsed, the operation described above is preferably reiterated.

Then, in a second time interval $\Delta T_2$ equal to Ts, the control means 110 once again activate the different count means $100_0, \ldots, 100_7$, from the first count means $100_0$ to the 8th count means $100_7$, at uniformly distributed instants in this second time interval $\Delta T_2$ and in the same order as before.

In this second time interval $\Delta T_2$, the detection instants or moments of the said two adjacent count means $100_j$ and $100_{j+1}$ occur at times $t_j+Ts$ and $t_{j+1}+Ts$ respectively, and then once again enclose the phase reference of the signal $S_1$ in time.

For example, at an instant denoted $t_3+Ts$ (reference 220 on time diagram $Cpt_3$), the count means $100_3$ corresponding to time diagram $Cpt_3$ has detected a <<low>> state of the signal $S_1$ within the time interval $\Delta T_2$, the value of the count variable $x_3$ with which it is associated remains unchanged and is equal to the value 0. The count means $100_4$ corresponding to time diagram $Cpt_4$ has detected a <<high>> state of the signal $S_1$ at another instant denoted $t_4+Ts$ (reference 230 on time diagram $Cpt_4$) within the time interval $\Delta T_2$, the value of the count variable $x_4$ with which it is associated is then incremented and set equal to the value 2.

The operation carried out during the first time interval $\Delta T_1$ and then during the second time interval $\Delta T_2$ can thus be reiterated identically over several time intervals equal to the period Ts until the time $t_{end}$ that will be called the end of capture time, at which the control means 110 described above stop activating the count means $100_0, \ldots, 100_7$, and at which these count means stop modifying their corresponding count variables. The total detection duration $\Delta T$ of the detection process may for example be such that:

$\Delta T = m*Ts$ (where 'm' is an integer number, preferably more than 1).

Several variant embodiments may be provided to start the end of capture process described above.

According to a first variant, it will be possible that the capture process could for example be completed after a fixed predetermined duration after the start instant to or a time that might vary, for example as a function of several factors such as the information throughput carried by the signal $S_1$, the signal to noise ratio for signal $S_1$.

Figure 3:
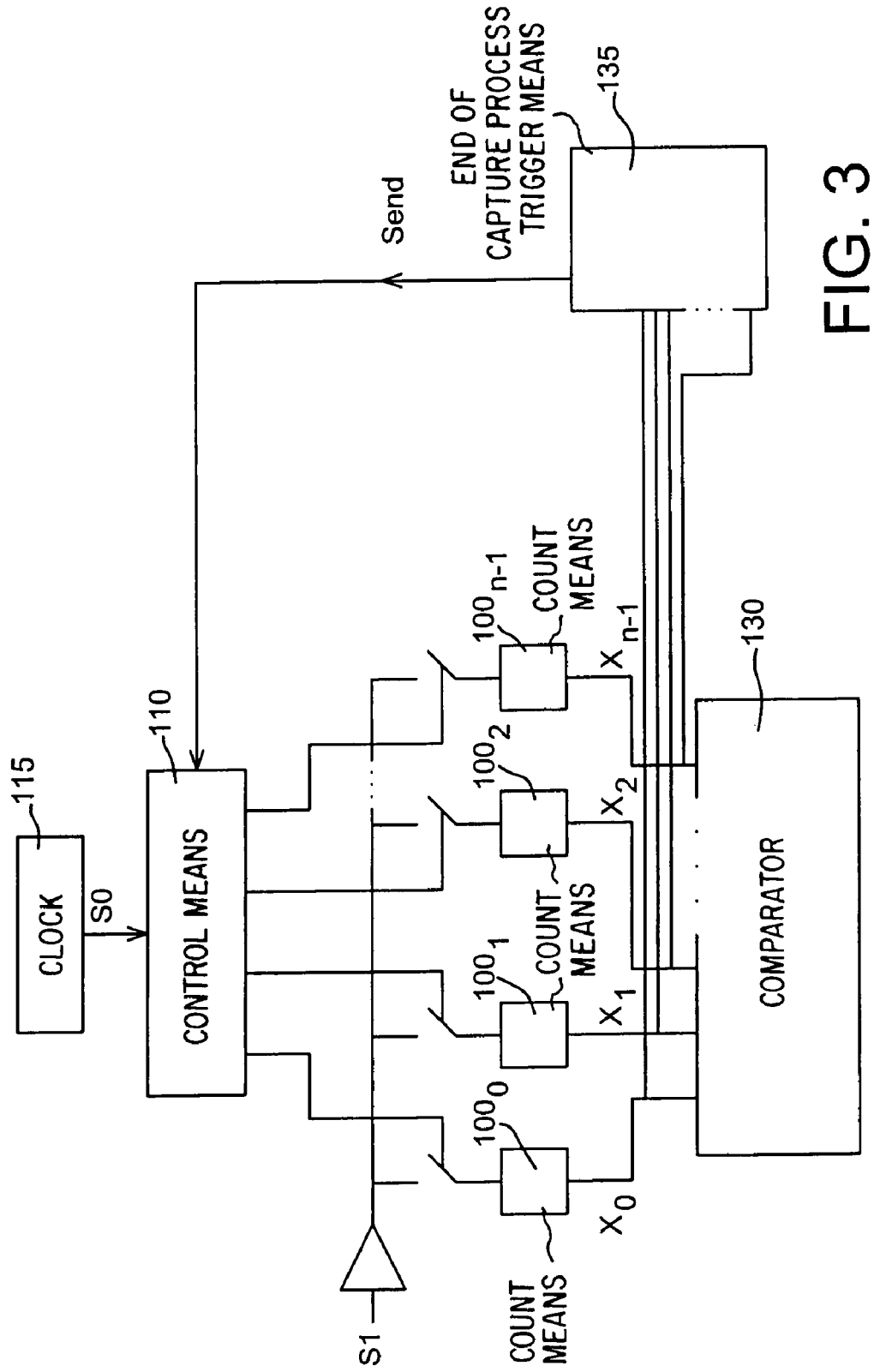
FIG. 3 illustrates a variant of the device used according to the invention.

According to a second variant illustrated on FIG. 3, specific means denoted 135 could be provided to trigger the end of capture process.

These means 135, for example formed by an arrangement of logical gates, can for example be used to compare the corresponding value of each of the count variables at the output from the different count means $100_0, \ldots, 100_7$, with a threshold Xthreshold__1. When a given count variable $x_i$ at the output from a given count means $100_i$ reaches the value of the threshold Xthreshold__1, the end of capture detection means 130 emit an end of capture signal $S_{end}$ at the output, for example to control means 110 so that they stop activating the count means $100_0, \ldots, 100_7$, and possibly to comparator means 120 at the end of a complete cycle.

The threshold Xthreshold_1 may be a predetermined fixed value. The threshold Xthreshold_1 may also be a variable initialized to a predetermined value that is modified during the count process as a function of one or several factors, for example such as the information throughput carried by the signal $S_1$, the signal to noise ratio related to signal $S_1$. The throughput is defined as the number of bits per second (bits that modulate the phase, in other words that carry the information).

When the end of capture instant $t_{end}$ has occurred, the control means 110 stop activating the count means $100_0, \ldots, 100_7$. Comparator means 130 like those described above are then used to compare the output value of each count variable $100_0, \ldots, 100_7$ with the output value of each "adjacent" or "neighbor" count variable and to identify the pair of adjacent count means with the greatest difference in count variables.

Instants or moments $t_j+k_1*Ts$ and $t_{j+1}+k_1*Ts$ (where j and $k_1$ are integer numbers) at which each of the count means in said pair of count means have made their detections, enclose, in time, the phase reference moment or instant. According to the previously described reference expression (1), the instants $t_j+k_1*Ts$ and $t_{j+1}+k_1*Ts$ coincide with instants $t_0+j*(Ts/n)+k*Ts$ and $t_0+(j+1)*(Ts/n)+k*Ts$ respectively.

The phase shift between the signal $S_0$ and the signal $S_1$ can then be estimated to be equal to a value between $(j*2\Pi)/n$ and $((j+1)*2\Pi)/n)$, for example $(j*2\Pi)/n$.

FIG. 2 shows an example count means $100_3$, the operation of which is illustrated by time diagram $Cpt_3$ and the count means $100_4$, the operation of which is illustrated by time diagram $Cpt_4$. The count means $100_3$ and the count means $100_4$ make their detections at instants $t_3+k_1*Ts$ and $t_4+k_1*Ts$ respectively, enclosing the phase reference time.

According to a third variant, the capture process described above may be completed when the difference in the count variable at the output from two adjacent count means, among all count means $100_0, \ldots, 100_7$, reaches a certain predetermined threshold Xthreshold_2.

In this third variant, the end of capture may be triggered for example by comparator means 130, or by other means provided for this purpose. The threshold Xthreshold_2 may be a fixed predetermined value. The threshold Xthreshold_2 may also be associated with a variable initialized to a predetermined value and which is modified during the count process for example as a function of one or several factors such as the information throughput carried by the signal $S_1$, the signal to noise ratio related to signal $S_1$.

The invention is not limited to detection of the phase of a digital signal and it can be applied to an analogue signal. Means, for example in the form of a comparator or an analogue/digital converter, may then be included in the device used according to the invention so that said analogue signal can be modified or so that processing can be done on a signal with two or more states as described above.

The invention can also be applied to phase detection of a signal comprising more than two logical states. It may be used to detect the phase of a signal $S_1$ digitized on several bits.

The detection principle may then be similar to that described above.

When a given count means $100_i$ ($i \in [0;n-1]$) is activated by control means 110 at a given instant or moment $t_i$, this given count means $100_i$ detects a state or a logical value of the signal $S_1$. The said given count means $100_i$ is then capable of modifying or not modifying a given count variable $x_i$ with which it is associated and for which it produces the output value, depending on the detected state of the signal $S_1$.

If the given count variable $x_i$ is modified, it consists of incrementing this count variable by an increment value $Q_2$ that can vary as a function of the state of the detected signal $S_2$. The state of the signal $S_2$ means the state of each of the bits forming the signal $S_2$.

This variant may be achieved for example using a device comprising a number of inputs equal to the number of bits in the signal $S_1$. Each of the count means can then detect the state of each bit making up the signal $S_1$.

For example, it would be possible for the count means to operate according to a signed logic:

For example, consider the case in which the signal $S_2$ is a signal digitized on 3 bits denoted $a_2a_1a_0$ where $a_2$ is a high order bit. It would be possible according to a first variant that a given count means $100_i$ then increments the given count variable $x_i$ with which it is associated, by a value equal to $-(a_1*2^1+a_0*2^0)$, when it detects a state or a logical level of the signal $S_2$ equal to '$0a_1a_0$' and a value equal to $+(a_1*2^1+a_0*2^0)$ when it detects a state or logical level of the signal $S_2$ equal to '$1a_1a_0$'. The sign of the increment value $Q_2$ may thus depend on the state of the signal $S_1$.

In the examples described above, the count means of the device according to the invention are used such that every time that a given count means detects a signal, said count means increments a count variable with which it is associated by an increment value that may be fixed or variable depending on the state of said signal, or leaves it unchanged.

This invention is not limited to these operating examples. The count means may be designed to perform more complex operations than a simple increment or summation during each detection. This means that the difference between the different count variables can be amplified more quickly, and the duration of the detection process can be reduced.

More generally, the count means in the device according to the invention may for example be designed such that every time that a given count means detects a signal, it increases a count variable with which it is associated or it leaves it unchanged. The increase may for example be made by multiplying the variable by a number proportional to or equal to the value of the state of the said signal during the detection, or by another mathematical function that possibly depends on the state of the signal at the instant or moment of the detection.

One particular application of the invention is in the domain of RFID (Radio Frequency IDentification) systems. A phase detection device used according to the invention may for example be integrated into an RFID read device for acquisition of data within another device, for example in the form of a label or transponder, by exchange of radiofrequency signals.

An RFID read device used according to the invention can then acquire data in a label or a transponder, using the following procedure:

The read device according to the invention is capable of emitting a signal S, starting from a carrier with a given frequency.

In response to this carrier, the transponder or the label emits another phase modulated signal $S_1$. This other signal $S_1$ is usually formed according to predetermined protocol, from a sub-carrier with a frequency that is sub-multiple of the frequency of the said carrier emitted by the read device.

The other signal $S_1$ may possibly comprise noise (phase skip, parasite pulses).

The said read device according to the invention is then capable of creating a signal $S_0$ with period Ts equal to the period of said sub-carrier from which the signal $S_1$ emitted by the label of the transponder is formed, so that the read device can read variations of the other signal $S_1$ emitted by the label or the transponder. For example, the signal $S_0$ may be formed from one or several piezoelectric based clock as was mentioned above or by frequency division of the carrier, using frequency division means. Thus, the frequency of the sub-carrier starting from which the other signal $S_1$ is formed, is known to the read device. The phase origin or the phase reference of the other signal $S_1$ remains to be determined, so that the other signal can be demodulated.

In order to determine this phase origin, an estimate of the phase shift between the reference signal $S_0$ and the signal $S_1$ can then be made using a process like that described above. This phase shift estimate can then be used to generate a signal $S'_0$ with a period equal to the period Ts of the sub-carrier and synchronized with $S_1$ so as to determine the phase modulations of $S_1$ that carries the information.

This process could begin as soon as the read device receives the signal $S_1$.

The invention claimed is:

1. A method for estimating the phase shift of a signal $S_1$ with a period approximately equal to period Ts with respect to a reference signal $S_0$ with period Ts, comprising receiving the signal $S_1$ and starting a capture process including steps of:
   a) at instants regularly distributed within a first time interval equal to the period Ts, carrying out a sequence of n detections of the state of the signal $S_1$, where n is an integer greater than 1, and for each of these detections, increasing a count variable in a sequence of n count variables $x_0, \ldots, x_{n-1}$, or leaving said count variable unchanged depending on said state,
   b) reiterating step a) over one or several other time intervals, each equal to said first time interval,
   c) stopping the capture process at an end of capture instant $t_{end}$,
   d) comparing corresponding values of count variables for adjacent count means, in pairs in said sequence of count variables $x_0, \ldots, x_{n-1}$,
   e) identifying the two adjacent count variables $x_j$ and $x_{j+1}$ with the greatest difference, among the differences between two adjacent variables, where j is an integer,
   f) calculating the phase shift between $S_0$ and $S_1$.

2. A method according to claim 1, wherein increasing said count variable in step a) includes increasing said count variable by a fixed increment value, or by an increment value that can vary as a function of said state.

3. A method according to claim 1, step a) being reiterated for an integer number of periods with duration Ts.

4. A method according claim 1, wherein the capture process is reiterated until one of the count variables reaches a value Xthreshold_1, Xthreshold_1 being predetermined or/and may vary during said capture process.

5. A method according to claim 1, wherein the capture process is reiterated until the difference in the count variable at the output from two adjacent count means reaches a threshold Xthreshold_2, Xthreshold_2 being predetermined or/and may vary during the said capture process.

6. A method according to claim 1, wherein the signal $S_1$ is a digital signal.

7. A method according to claim 1, wherein the digital signal is obtained by digitizing an analogue signal.

8. A method according to claim 1, wherein the signal $S_1$ is an analogue signal.

9. A method according to claim 1, wherein the signal $S_1$ is a signal digitized on several bits.

10. A method according to claim 1, wherein the count means increment the count variable by an increment value $Q_2$ that can vary as a function of the state of the detected digitized signal.

11. A method according to claim 1, wherein the phase shift is estimated by a value chosen within an interval between $(j/n)*2\Pi$ and $((j+1)/n)*2\Pi$.

12. A method according to claim 1, wherein a signal $S_0$ with period Ts is generated by the read device.

13. A method for estimating the phase shift of a signal $S_1$ with a period approximately equal to period Ts with respect to a reference signal $S_0$ with period Ts, comprising steps of receiving the signal $S_1$ and starting a capture process including steps of:
   a) at instants regularly distributed within a first time interval equal to the period Ts, carrying out a sequence of n detections of the state of the signal $S_1$, where n is an integer greater than 1, and for each of said detections, increasing a given count variable in a sequence of n count variables by a fixed increment value, or by an increment value that can vary as a function of said state, or leaving said count value unchanged depending on said state,
   b) reiterating step a) over one or several other time intervals, each equal to said first time interval, until one of the count variables reaches a value Xthreshold_1 that can be predetermined or/and can vary during said capture process, or/and until the difference in the count variable at the output from two adjacent count means reaches a threshold Xthreshold_2, that can be predetermined or/and can vary during the said capture process,
   c) stopping the capture process at an end of capture time $t_{end}$,
   d) comparing the corresponding values of count variables for adjacent count means, in pairs in said sequence of count variables $x_0, \ldots, x_{n-1}$,
   e) identifying the two adjacent count variables $x_j$ and $x_{j+1}$ with the greatest difference, among the differences between two adjacent variables, where j is an integer,
   f) calculating the phase shift between $S_0$ and $S_1$.

14. A method of reading a transponder or a label comprising:
   emitting a signal with a predetermined frequency, by a read device,
   receiving another signal $S_1$ emitted by the transponder or the label, by the read device,
   implementing a method according to one of claim 1 or 13.

15. A device for estimating the phase shift of a signal $S_1$ with a period approximately equal to Ts with respect to a reference signal $S_0$ with period Ts, comprising:
   n count means, wherein n is an integer greater than 1, each of the count means when activated being capable of detecting an instantaneous state of signal $S_1$ and increasing a count variable with which said instantaneous state is associated among n count variables, or leaving said count variable unchanged, as a function of said instantaneous state,
   control means capable of periodically and successively activating said n count means in a predetermined order, within a time interval with a duration equal to the period Ts of the signal $S_0$ and at regularly distributed times in said time interval,
   comparator means capable of comparing the values of count variables in each adjacent count means, among the n count variables of the n count means, in pairs, and when said comparing is performed, said comparator means determine the greatest difference, means capable of estimating the phase shift between $S_0$ and $S_1$ as a function of said greatest determined difference.

16. A device according to claim 15, each of the count means, when activated, being capable of detecting an instantaneous state of the signal $S_1$ and incrementing a count variable with which said instantaneous state is associated among the n count variables, or leaving said count variable unchanged, as a function of said instantaneous state.

17. A device according to claim 15, also including: means for determining an average value of the signal $S_1$, each of the count means, when activated, being capable of detecting an instantaneous state of the signal $S_1$ and incrementing a count variable with which said instantaneous state is associated among the n count variables, or leaving said count variable unchanged, as a function of said instantaneous detected state and said average value of the signal $S_1$.

18. A device according to claim 15, also including means capable of generating a signal $S_0$ with period Ts.

19. A device according to claim 15, including means capable of generating a signal $S_0$ with period $T_S$, comprising a clock or/and frequency division means.

20. A device for estimating the phase shift of a signal $S_1$ with a period approximately equal to Ts with respect to a reference signal $S_0$ with period Ts, comprising:
   means capable of generating a signal $S_0$ with period $T_S$,
   n count means, where n is an integer greater than 1, each of the count means, when activated, being capable of detecting an instantaneous state of the signal $S_1$ and incrementing a count variable with which said instantaneous state is associated among the n count variables, or leaving said count variable unchanged, as a function of said instantaneous state,
   control means capable of periodically and successively activating said n count means in a predetermined order, within a time interval with a duration equal to the period Ts of the signal $S_0$ and at regularly distributed instants in said time interval,
   comparator means capable of comparing values of count variables in each adjacent count means, among the n count variables of the n count means, in pairs, and when said comparing is performed, said comparator means determine the greatest difference,
   means capable of estimating the phase shift between $S_0$ and $S_1$ as a function of said greatest determined difference.

21. An RFID (Radio Frequency IDentification) read device for a transponder or a label comprising:
   means capable of emitting signals to be sent to a label or a transponder,
   means capable of receiving signals $S_1$ originating from a label or a transponder, and
   a device according to one of claims 15 or 20.

* * * * *